(12) United States Patent
Dodabalapur et al.

(10) Patent No.: US 6,410,416 B1
(45) Date of Patent: Jun. 25, 2002

(54) ARTICLE COMPRISING A HIGH-RESOLUTION PATTERN ON A NON-PLANAR SURFACE AND METHOD OF MAKING THE SAME

(75) Inventors: Ananth Dodabalapur, Millington; John A. Rogers, New Providence; Richart Elliott Slusher, Lebanon, all of NJ (US)

(73) Assignee: Agere Systems Guardian Corp., Orlando, FL (US)

( * ) Notice: Subject to any disclaimer, the term of this patent is extended or adjusted under 35 U.S.C. 154(b) by 0 days.

(21) Appl. No.: 09/322,471

(22) Filed: May 28, 1999

(51) Int. Cl.[7] ............................................... H01L 21/44
(52) U.S. Cl. ...................... 438/615; 438/745; 438/749; 438/725; 385/80; 385/84; 385/135; 385/136; 385/137; 385/147
(58) Field of Search ........................... 385/80, 84, 135, 385/136, 137, 147; 438/615, 725, 745, 749

(56) References Cited

U.S. PATENT DOCUMENTS

| | | | | |
|---|---|---|---|---|
| 5,553,186 A | * | 9/1996 | Allen | 385/135 |
| 6,085,004 A | * | 7/2000 | Dower et al. | 385/80 |
| 6,087,199 A | * | 7/2000 | Pogge et al. | 438/106 |
| 6,255,035 B1 | * | 6/2001 | Minter et al. | 430/312 |

* cited by examiner

Primary Examiner—David Nelms
Assistant Examiner—Reneé R. Berry
(74) Attorney, Agent, or Firm—Lowenstein Sandler PC

(57) ABSTRACT

An article is disclosed having a non-planar surface with a high-resolution pattern formed thereon, particularly a distributed-feedback (DFB) ridge waveguide laser. An elastomeric member having relief patterns on its surface is used to print or mold a pattern directly onto the non-planar surface of the waveguide. A range of materials disposed on such non-planar surfaces can thus be patterned at high resolution to provide devices with sub-micron features at low cost with potential applications in optoelectronics. For example, a plastic laser based on molded organic gain materials may be made.

8 Claims, 7 Drawing Sheets

ARTICLE COMPRISING A HIGH-RESOLUTION PATTERN ON A NON-PLANAR SURFACE AND METHOD OF MAKING THE SAME

FIELD OF THE INVENTION

This invention relates to an article having a non-planar surface with a high-resolution pattern formed thereon and a method of making the article comprising use of an elastomeric relief member. The invention is particularly useful in fabricating distributed-feedback ridge waveguide lasers and other structures in integrated optics that rely on gratings or photonic crystals formed on non-planar surfaces.

BACKGROUND OF THE INVENTION

In the fields of optics and electronics, there is continuing interest in developing smaller-sized devices, e.g., devices that consume less space, use less power, operate more quickly, and exhibit higher performance than their larger counterparts. Low cost devices affordable to consumers are sought. The drive toward miniaturization has precipitated the development of new materials for use in optic and electronic devices and new techniques of fabrication.

Recently, interest has grown in electronic devices that use organic materials as conducting, semiconducting, and light-emitting materials. Organic materials are attractive for use in optic and electronic devices as they are compatible with plastics and can be easily fabricated to provide low-cost, lightweight, and flexible devices with plastic substrates. For example, low cost, electrically-pumped lasers could be made supported by lightweight, flexible plastic substrates. Simple fabrication techniques combine with the relative ease of processing and depositing organics to allow rapid prototyping of new resonator designs and the cost-effective commercialization of plastic laser technologies.

New patterning methods also are being explored to provide higher resolution patterns in conventional materials ($SiO_2$) so that devices with small features can be made easily in geometries and fabrication sequences that are incompatible with traditional patterning techniques. Many non-conventional patterning methods having sub-micron resolution are currently being explored including microcontact printing, molding and embossing. See D. Qin, "Microfabrication, Microstructures, and Microsystems," TOPICS IN CURRENT CHEM. (1998), at p. 1–20, discussing various patterning techniques, which is hereby incorporated herein by reference. Molding techniques have not, however, been exploited to directly pattern gain materials for laser applications. In addition, although printing methods have been used to form planar resonators, they have not been used to form resonators directly on non-planar structured surfaces that are difficult to pattern using conventional methods.

There is an increasing need to develop simple methods for forming high-resolution patterns on non-planar surfaces, for example, for distributed feedback (DFB) laser devices that have applications in integrated optics, in optical measurement, communication and transmission, optical recording, laser printers, and the like. A ridge waveguide type DFB semiconductor laser includes a semiconductor substrate having protruding stripe-like ridge layers with diffraction gratings formed on the surface of the ridge layers. Methods for successfully applying micro-printing and molding techniques have not been applied to provide high-resolution patterns in fabricating diffraction gratings and resonator structures for applications in integrated optics. Also, none of the conventional lithographic methods (holographic exposure, photolithography, electron-beam lithography, etc.), can be used to form high-resolution patterns directly on non-planar surfaces, such as those of ridge waveguides, because it is impossible to form uniform layers of resist on non-planar surfaces using standard procedures such as spin-casting and spraying. Thus, DFB ridge-type lasers have been fabricated by first forming a pattern or grating on a planar surface, followed by forming the ridge. See, e.g., U.S. Pat. No. 5,880,028 issued Mar. 9, 1999 to Yamamoto et al, "Ridge Waveguide Type Distributed Feedback Semiconductor Laser Device and Method for Manufacturing the Same," which is hereby incorporated by reference. This approach demands a specific sequence for the patterning (e.g., the high-resolution features must be defined before the ridges), which among other things inhibits flexibility.

As may be appreciated, those concerned with technologies involving optic and electronic devices or systems continue to search for new methods of patterning substrates, including non-planar substrates, that enable more flexible processing and reduced cost. In particular, it would be advantageous to provide a high-resolution patterning technique that may be used in directly patterning non-planar surfaces, e.g., for use in fabricating ridge waveguide structures.

SUMMARY OF THE INVENTION

Summarily described, the invention comprises an article including an electronic or optical device, in which the device has a substrate with a non-planar surface. A high-resolution patterned layer is formed directly on the non-planar surface with use of a relief member, preferably a flexible member, that can impose, by contact, a pattern on the non-planar surface. The device may be comprised of a plurality of materials including plastic or glass or at least one material selected from the group of poly(p-phenylene vinylene) (PPV), silica glasses, cellulose acetate, $KH_2PO_4$ (KDP), polysterene microspheres, polyimide, polyester, and polymethylmethacrylate. In a preferred embodiment, the device comprises a distributed-feedback ridge waveguide structure. A method for forming the device comprises providing an elastomeric member having relief geometries on its surface defining a pattern; contacting the non-planar surface of the substrate with the elastomeric member so that the pattern of the elastomeric member is imposed on the non-planar surface; and shaping portions of the non-planar surface following the pattern imposed by the elastomeric member to define the patterned layer. This method may comprise a printing or molding procedure.

BRIEF DESCRIPTION OF THE DRAWINGS

To illustrate the invention, there is shown in the drawings a form of the invention which is presently preferred, it being understood, however, that the invention is not limited to the arrangements shown.

5B reflects ridge waveguide structures; FIG. 5C reflects printed gold lines on the top non-planar surfaces of ridge waveguides; FIG. 5D reflects DFB waveguide resonators formed by reactive ion etching; and FIG. 5E reflects a DFB waveguide laser;

DETAILED DESCRIPTION OF THE INVENTION

Figure 1:
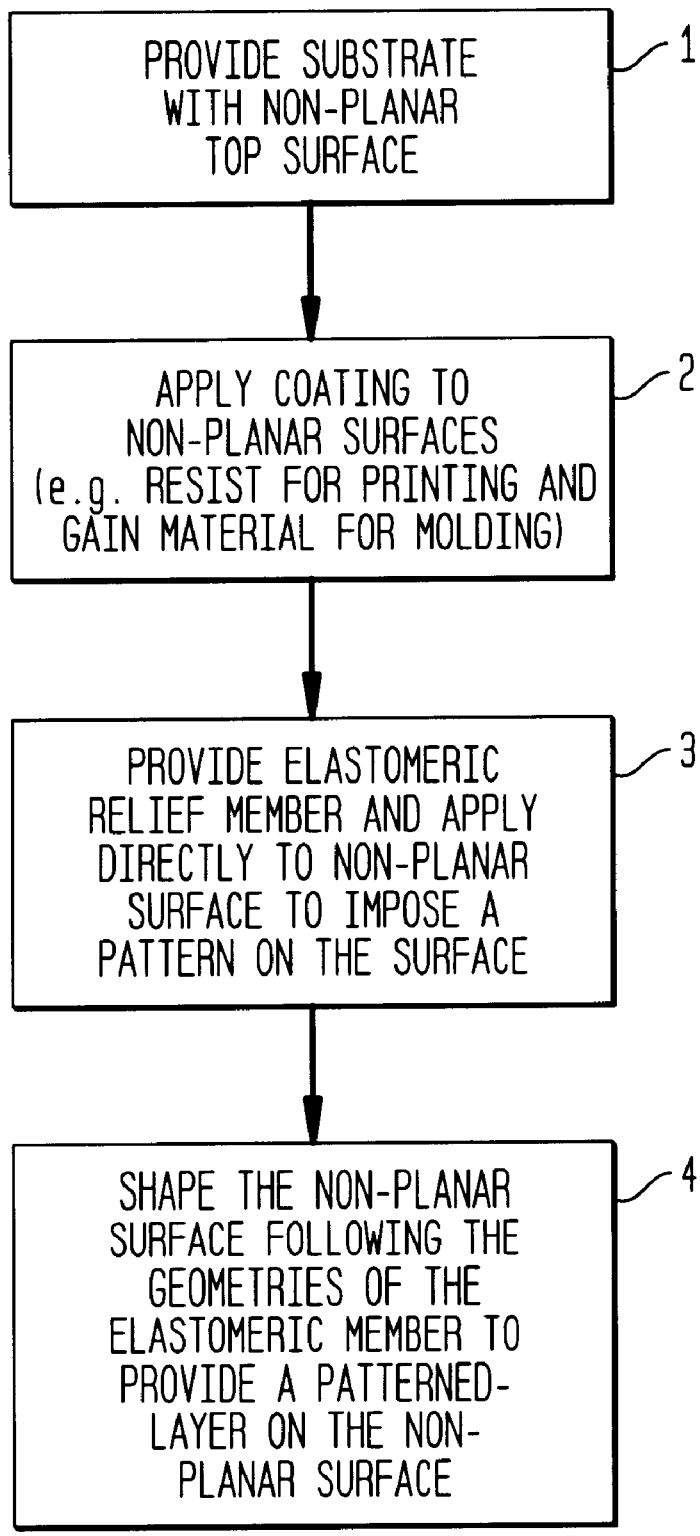
FIG. 1 is a block diagram showing steps of the inventive method.

This invention comprises an article including a device having a non-planar surface with a high-resolution pattern formed thereon. The pattern is formed directly on the non-planar surface with use of a member, preferably a member that is elastomeric or mechanically flexible. The member has relief geometries on its surface and may comprise an elastomeric stamp or an elastomeric mold. In other words, the pattern may be formed on the non-planar surface, rather than on a planar surface followed by formation of the non-planar structures (as in previous methods), which is what is meant herein by use of the word "directly." A high-resolution pattern may be defined on the surface of the substrate having a resolution of about 30 $\mu$m or smaller, or more preferably about 10 $\mu$m or smaller. In many cases, this pattern serves as a one or two-dimensional photonic crystal, in which case the resolution of the device is comparable to or less than the wavelength of light that propagates in the device. For example, with red light, this resolution may be on the order of or less than 0.3 $\mu$m. An elastomeric member is advantageous in that it may be applied to highly non-planar surfaces due to its ability to conform to curved or structured surfaces. Contact of the elastomer with the surface to be patterned may cause distortions in the elastomer and, in turn, in the pattern itself These distortions can be minimized my molding fluids that can flow to allow residual stresses in the member to relax before the pattern is actually formed (i.e., when the fluid is solidified). Use of the elastomeric member in this manner provides structures having high spatial coherence and low distortions that may be used for integrated optics applications. The method is well-suited to application to non-planar substrates as there is no need to deposit uniform layers of spin cast resist or to perform focussing operations.

To fabricate the inventive devices, an inventive process is used in which the elastomeric member is used to impose a pattern directly on a non-planar surface and then the non-planar surface is shaped in the pattern defined by the member. High-resolution one and two dimensional patterns of photonic crystals, gratings, or other feedback structures are rubber stamped or molded on the non-planar surfaces, such as ridge waveguides. Periodic arrays of nanostructures may be formed, with low distortions and good uniformity. The resulting structures may be used as waveguide laser resonators, waveguide spectral filters and reflectors, or connecting devices, such as photonic crystals used to augment or connect two conventional waveguide devices. For example, printed photonic crystals can be used to enable highly efficient coupling between two ridge waveguides intersecting at right angles.

In a preferred embodiment, the invention comprises a complex resonator that uses a distributed feedback structure on the top surfaces of ridge waveguides. The inventive article also may include plastic photopumped lasers that use such resonators. The invention is described below particularly with reference to the fabrication of a distributed-feedback (DFB) ridge waveguide resonator and laser. However, it should be understood that this discussion is exemplary only; the invention may include other articles and methods involving the high-resolution patterning of a layer on a non-planar substrate. The term non-planar substrate is not intended to encompass a continuously curved optical fiber or cylindrical microcapillary.

FIG. 1 shows a block diagram of steps of a method for making the patterned layer on the non-planar surface. FIGS. 2A–2D and 3A–3D illustrate structures in the process of being patterned using a microprinting (FIGS. 2A–2D) and a molding technique (FIGS. 3A–3D), to form a distributed feedback resonator and laser. In both processes, a substrate is provided (FIG. 1, block 1) that preferably comprises a planar ridge waveguide structure having a base layer 12 and an insulating or oxide layer 14 (also called an active layer) with top surfaces comprising ridge waveguides (e.g., 16a, 16b, 16c). The base layer preferably is comprised of silicon. Although three ridge waveguide structures (16a, 16b, 16c) are shown in the figures, this invention may be applied to structures having a multitude of waveguides, e.g., up to 100 or more waveguides. These waveguides can be formed using printing or molding techniques or with a variety of conventional methods. Advantageously the layer 12 and/or 14 comprises a material that is substantially transparent to light with wavelengths between about 0.1 and 100 microns.

Figure 2A:
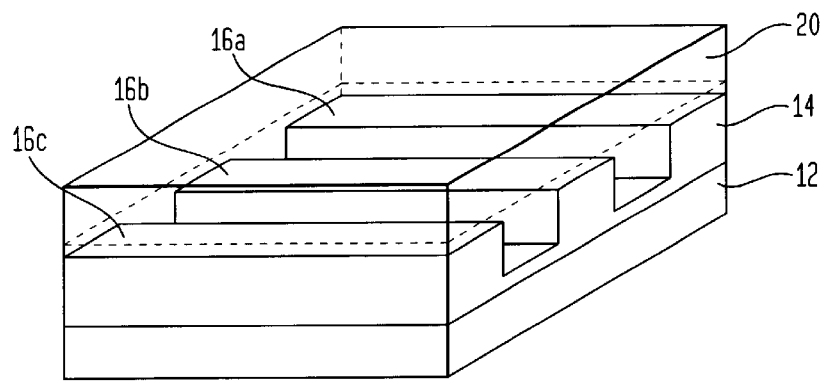
FIGS. 2A–2D schematically illustrate steps for performing a micro-printing technique of the invention.
Figure 3A:
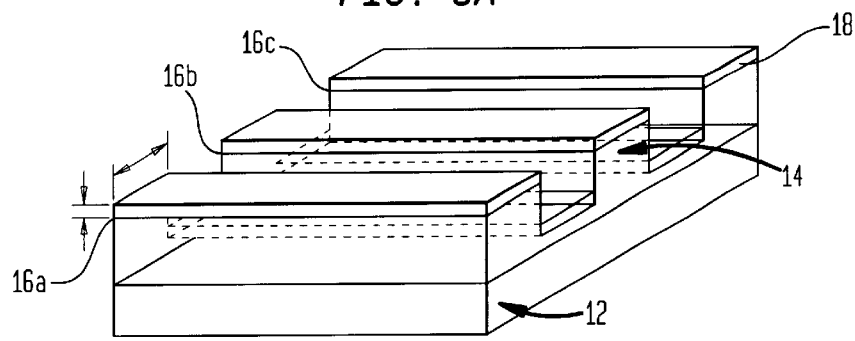
FIGS. 3A–3D schematically illustrate steps for performing a molding technique of the invention.

In the fabrication, the non-planar ridge surfaces of the waveguide are coated with a layer of either resist or gain material 18 (FIG. 1, block 2). In the microprinting technique, a layer of material capable of functioning as a resist is applied (not shown in FIG. 2A), by thermal or electron beam evaporation. Advantageously, the resist layer comprises a thin layer of gold or silver. An adhesive-promoting material may be used as well. For example, in a preferred embodiment, a thin layer of titanium (Ti-10 angstroms) is used, followed by a thin layer of gold (Au-200 angstroms), with the titanium being applied for promoting adhesion. Of course, other resist and adhesive-promoting materials (e.g., chromium), can be used as well, as are known in the field. In the molding technique, a gain material 18 (which may include an organic gain material) is applied to the ridge surfaces (FIG. 3A). Various organic materials that may be used in the fabrication of the inventive devices are described in U.S. patent application Ser. No. 08/770,535, filed Dec. 20, 1996, "Method of Making an Organic Thin Film Transistor," by Zhenan Bao et al, assigned to the present assignee, which is hereby incorporated by reference. Inorganic gain materials also may be used, as known in the field, such as Nd:YAG, NdYVO$_4$, Nd:doped glass, or any other materials that can provide optical gain.

In the micro-printing technique, the printing is performed directly on the coated top surface of the non-planar substrate (e.g., on the resist- or gold-coated surface of the ridge waveguides). The printing is performed with use of an elastomeric stamp 20 (FIG. 2A). Steps for making an elastomeric stamp are described in U.S. patent application Ser. No. 09/305,722, to Bao et al., filed May 5, 1999, titled "High-Resolution Method for Patterning A Substrate with Micro-printing," which is assigned to the present assignee and incorporated herein by reference. Preferably, for this application the stamp is provided by curing an elastomeric polymer (polydimethylsiloxane) against a surface relief grating having a period of 600 nm.

Figure 2B:
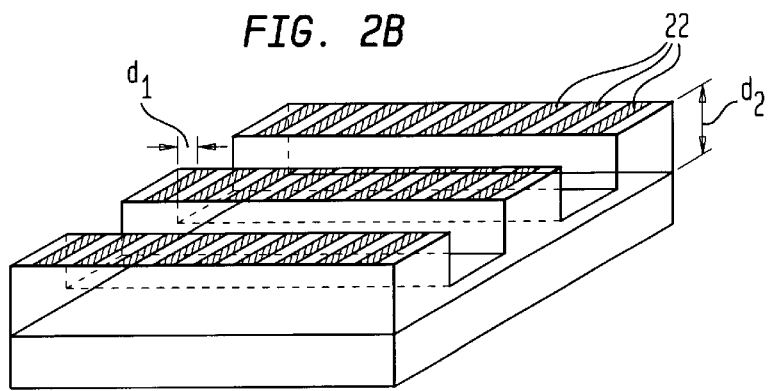
Figure 2C:
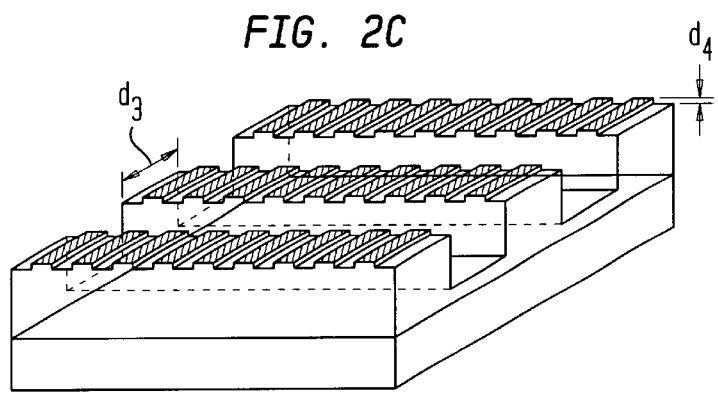
Figure 3B:
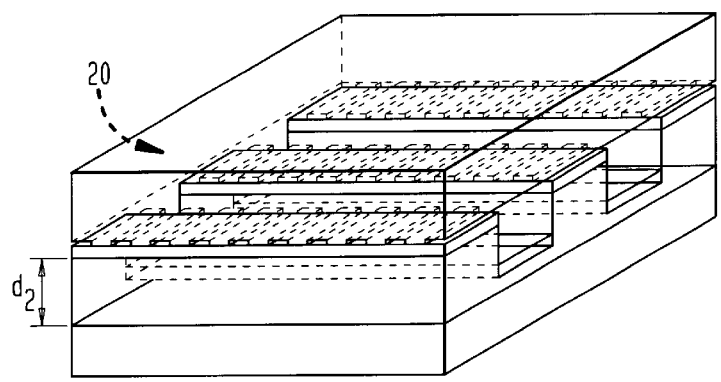

Microcontact printing of the surface preferably is performed to generate an array of parallel lines on the layer of resist material. The stamp is placed in contact with an inking material, such as alkanethiol or alkylsiloxane ink, e.g., a solution of hexadecanethiol. An inked pattern 22 is transferred to the top surface of the substrate, that is, on the top surfaces of the ridge waveguides (FIG. 2B). The printing may be performed on an array of substrates or waveguides, as shown in FIGS. 2A–2B. In a preferred embodiment, the printing produces an array of gold lines (300 nm wide and having 300 nm separation), on the top surface of the ridge waveguides (e.g., distance $d_1$ of FIG. 2B is 300 nm). The ridge waveguides may be about 2 micrometers deep ($d_2$ of FIGS. 2B and 3B is ~2 $\mu$m), 10 micrometers in length ($d_3$ of FIG. 2C is ~10 $\mu$m) and separated from one another by a distance of about 10 $\mu$m. The ridge waveguide structure in a preferred embodiment is supported by silicon.

Figure 2D:
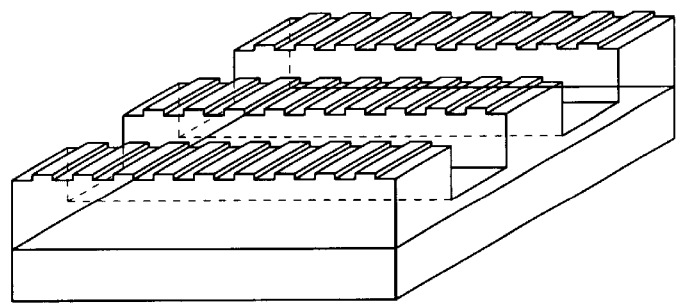

The next step of the microprinting technique involves shaping of the non-planar structures (FIG. 1, block 4) by removal of the exposed regions of the substrate surface (i.e., the portions of the top surfaces of the ridge waveguides that are not protected with ink are removed). Wet chemical etching may be used, preferably with an aqueous ferri/ferrocyanide solution. The exposed layer of resist material (e.g., gold) is removed, preferably to provide parallel lines of resist material (e.g., gold) substantially covered in ink. A periodic surface relief with a depth of about 50 nm (e.g., distance $d_4$ of FIG. 2C is about 50 nm), in the underlying oxide is then produced by reactive ion etching the exposed oxide. This etch does not disturb the gold and therefore does not remove regions of the oxide that are coated with gold. The remaining gold (or other material comprising the resist layer) may be removed after the reactive ion etching to complete the patterned structure, e.g, a resonator structure (FIG. 2D). Gold may be removed using a potassium iodide wet etch. Of course, other etchants known in the field may be used which may depend upon the material comprising the resist layer. A distributed feedback waveguide laser may be produced by sublimination of a film of tris(8-hydroxyquinoline) aluminum (Alq) doped with 0.5–5.0 weight percent of the laser dye DCMII onto the resonator structure of FIG. 2D. Preferably the Alq film is about 200 nm in thickness. Steps for printing and molding techniques to fabricate DFB and Bragg reflector resonators based on patterned surface relief in plastic and glass are also discussed in Rogers et al, "Using Printing and Molding Techniques to Produce Distributed Feedback and Bragg Reflector Resonators for Plastic Lasers," APPL. PHYS. LETT. Vol. 73 (1998), at p. 1766, which is incorporated herein by reference.

Figure 3C:
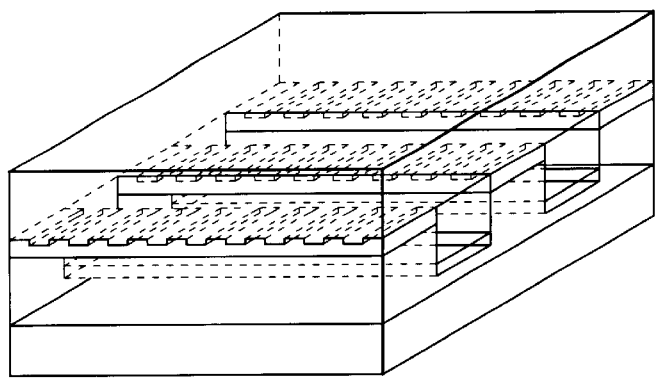
Figure 3D:
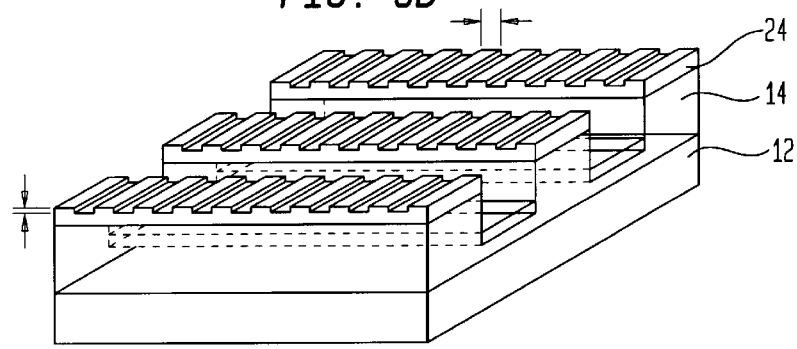

In the molding technique, the substrate 10 is first provided which preferably comprises a ridge waveguide structure having a base silicon layer 12 and an insulating or oxide layer 14 with top surfaces comprising ridge waveguides (e.g., 16a, 16b, 16c). In this process, the coating applied to the top surfaces (FIG. 1, block 2), comprises gain material 18 (FIG. 3A). An elastomeric mold 20 (prepared in the same fashion as the elastomeric stamp discussed above), is then placed onto the ridge waveguide structure and in contact with the gain media on the ridges of the waveguide (FIG. 3B). To shape the non-planar surface to conform to the relief geometries of the elastomeric mold (FIG. 1, block 4), the gain media is heated so that it softens and flows to conform to the relief structures on the surface of the mold (FIG. 3C). Advantageously this heating may be performed by illuminating the gain material with ultraviolet light, e.g, from a laser at a wavelength at which the mold is transparent. For example, when the elastomeric mold is fabricated with polydimethylsiloxane, it will be transparent at a wavelength of 337 nm; a pulsed nitrogen laser is advantageously applied at about 2 ns and 10 kW/cm$^2$. The mold is then removed (FIG. 3D), and a layer of embossed gain media 24 is left on the raised portions of the ridge waveguides to yield a distributed feedback laser.

Figure 4A:
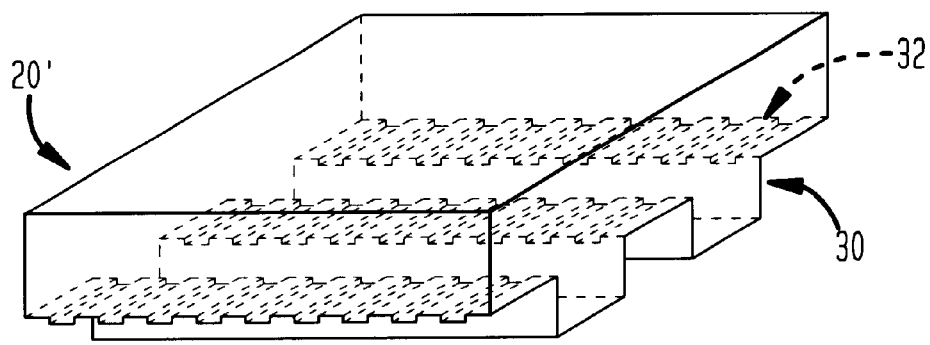
FIGS. 4A–4C schematically illustrate steps for performing an alternative embodiment of the molding technique of the invention.
Figure 4B:
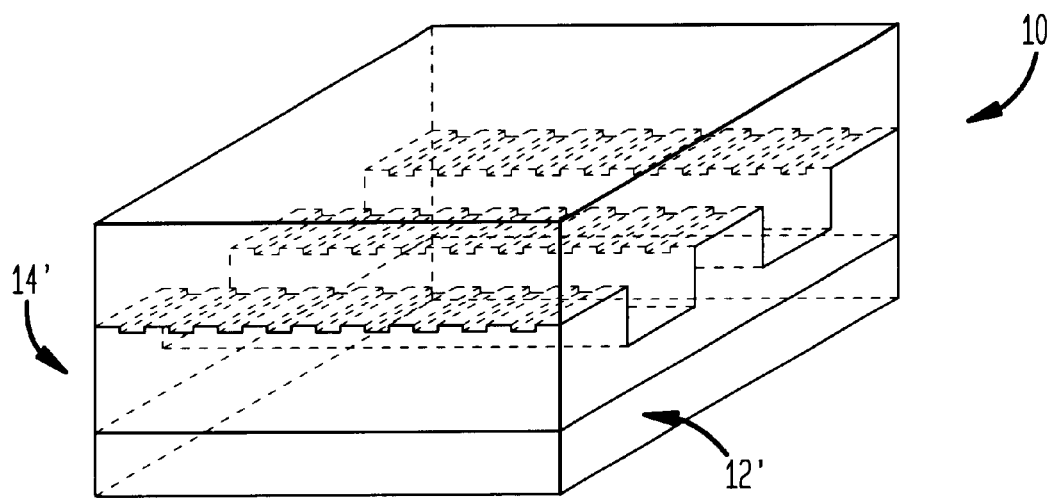
Figure 4C:
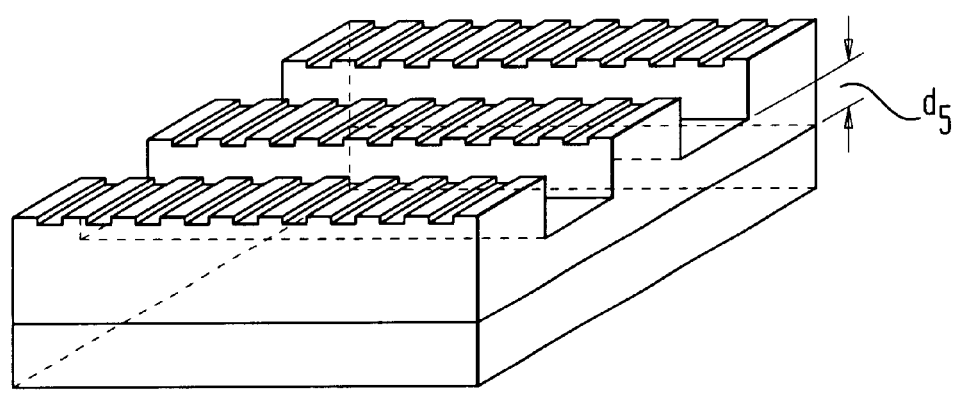

FIGS. 4A–4C illustrate alternative steps for performing a molding technique. In this embodiment, the relief mold 20' (FIG. 4A), has two layers of surface relief, e.g., one layer 30 for defining ridge waveguide structures, and a second layer 32 for forming the patterned layer on the top surfaces of the ridge waveguides. Here, the mold is applied to a structure 10 (FIG. 4B) advantageously having a base layer 12' comprising glass and an insulating layer 14' comprising a prepolymer of polyurethane. While the mold is in contact with the structure 10, uv light is applied to cure the polyurethane. The elastomeric mold is then removed to provide a resonator structure (FIG. 4C). Advantageously, the distance $d_5$ defining the depth of the planar portion of the insulating layer 14' is about 5–100 $\mu$m.

Figure 5A:
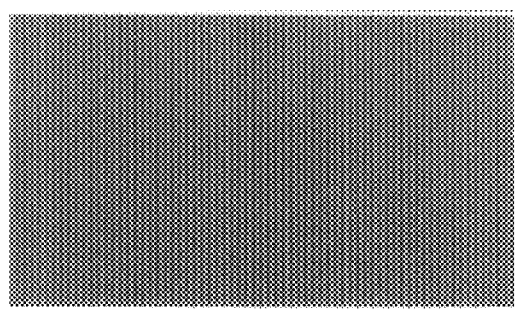
FIGS. 5A–5E show optical micrographs wherein FIG. 5A reflects stamps or molds with 300 nm lines and spaces; FIG.
Figure 5B:
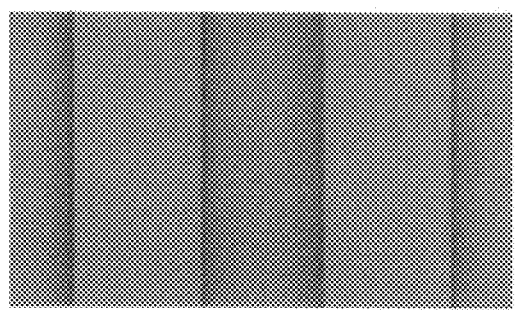
Figure 5C:
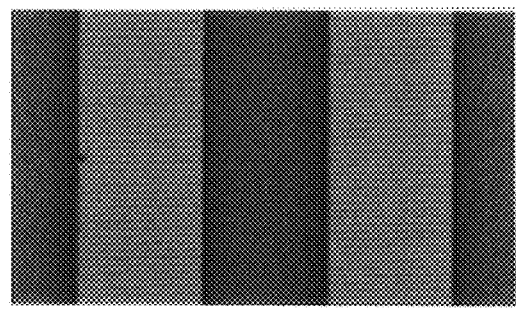
Figure 5D:
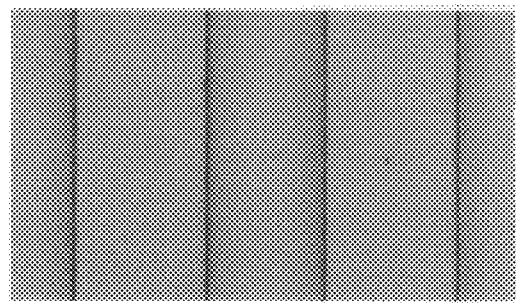
Figure 5E:
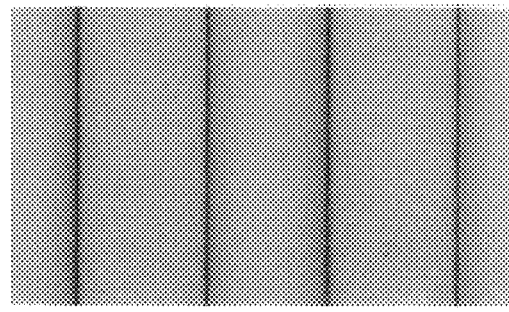

FIGS. 5A–5E are optical micrographs of various structures formed during fabrication of the DFB laser. FIG. 5A reflects the stamp or mold surface having 300 nm lines and spaces that were formed by casting and curing an elastomeric prepolymer against a surface relief grating. FIG. 5B reflects a ridge waveguide structure having channels about 2 $\mu$m deep ($d_2$ of FIG. 2B is ~2 $\mu$m), 10 $\mu$m in length ($d_3$ of FIG. 2C is 10 $\mu$m), and separated from one another by a distance of about 10 $\mu$m, as preferred. FIG. 5C reflects printed gold lines on the top of ridge waveguides (e.g. as in FIG. 2B). FIG. 5D reflects DFB waveguide resonators formed by reactive ion etching the oxide and removing the gold (as in FIG. 2D). FIG. 5E reflects a DFB waveguide laser comprising molded gain media on ridge waveguides (e.g., as formed with the steps illustrated in FIGS. 3A–3D).

In applying either the microprinting or molding technique, the feedback or resonator structure may be formed directly on the non-planar structure of the ridge waveguide. This method offers simplicity and cost advantages as compared with standard techniques to form high-resolution feedback structures, in which the high-resolution patterns would first have to be formed on a planar surface and then the relatively low resolution waveguide structures defined (e.g., as described in the Yamamoto et al. patent). Also, the size of the printed or molded DFB structures is limited only by the size of the gratings used to make the stamps (e.g., they may extend over areas of about 1 cm$^2$) and the structure may encompass several hundred (>500) waveguides.

This invention provides numerous advantages. Both conventional and nonconventional materials may be manipulated directly on nonplanar substrates. The resulting structures can be used as resonators for working lasers or for other devices that are difficult to fabricate using other methods. A range of materials having non-planar surfaces can be patterned at high resolution to provide devices with sub-micron features at low cost with potential applications in many areas of optics and electronics. For example, suitable materials that can be patterned include poly(p-phenylene vinylene) (PPV), silica glasses, cellulose acetate, $KH_2PO_4$ (KDP), polysterene microspheres, polyimide, polyester, and polymethylmethacrylate. A plastic laser based on molded organic gain materials can be made. Plastic DFB ridge waveguide lasers can be fabricated that have thresholds as least comparable to the thresholds of non-planar devices and devices with similar geometries fabricated using photolithographic methods. In a preferred embodiment, for example, the base layer 12 (FIG. 3D) comprises silicon, the ridge structure 14 comprises oxide, and the patterned gain material 24 comprises Alq/DCMI. Thus, besides providing simple alternatives to conventional methods, the inventive technique offers flexibility in the materials, types of surfaces, and substrates that can be patterned.

Figure 6:
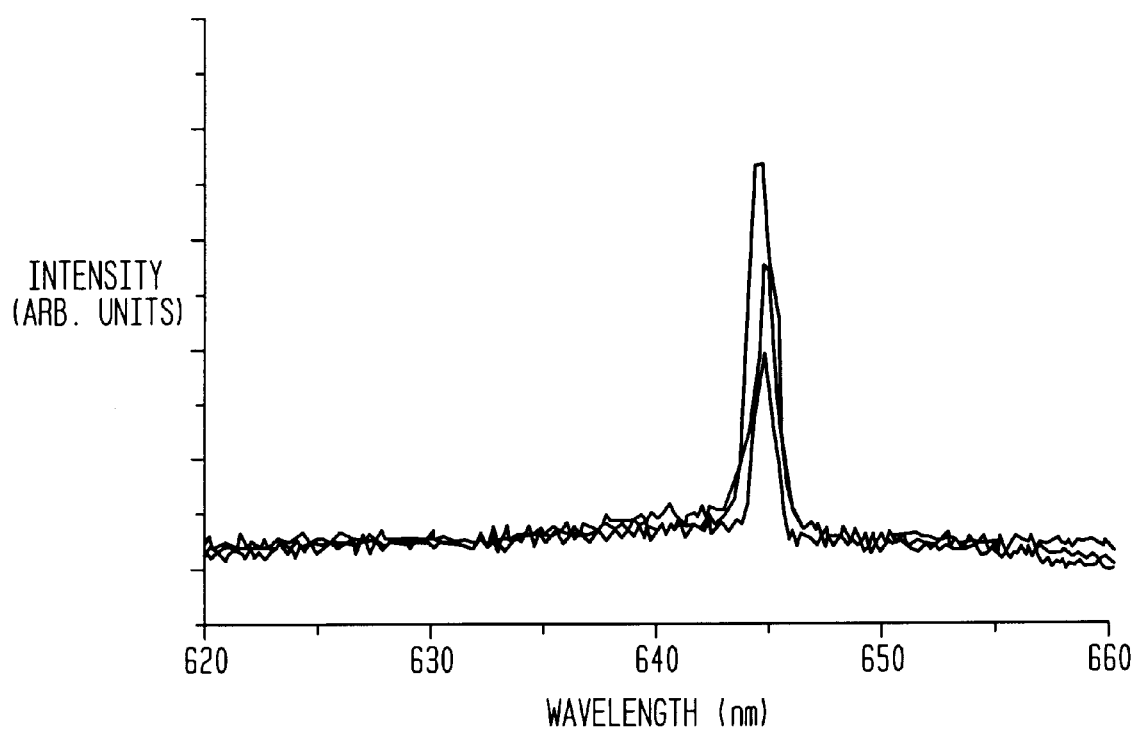
FIG. 6 is a graph reflecting the emission profile from a molded waveguide DFB laser photopumped with a laser focused (spot size~1mm$^2$) to various locations across a larger area (~1cm$^2$) of molded gain media.

With this invention, lasers may be produced with characteristics nearly identical to lasers fabricated with high-resolution photolithography and better than those fabricated with imprinting. Test results indicate that the patterning techniques may be useful as low-cost alternatives to conventional approaches (e.g., photolithography, electron beam lithography, and holographic patterning), in the fabrication of integrated optic devices. For example, the spectral characteristics of laser light emitted from a molded waveguide DFB laser were measured by photopumping (with a pulsed nitrogen laser) various ~1 mm$^2$ regions across a larger (~1 cm$^2$) patterned area. Three representative spectra are depicted in FIG. 6. The lack of significant dependence of the spectra on position is indicative of good macroscale spatial uniformity. The uniformity of the spectra tends to be higher in molded resonators than in printed ones. The ability of stresses (and hence deformations) in the mold to relax when the gain material softens (e.g., FIG. 3C), may lead to the smaller distortions in the molded patterns.

Figure 7A:
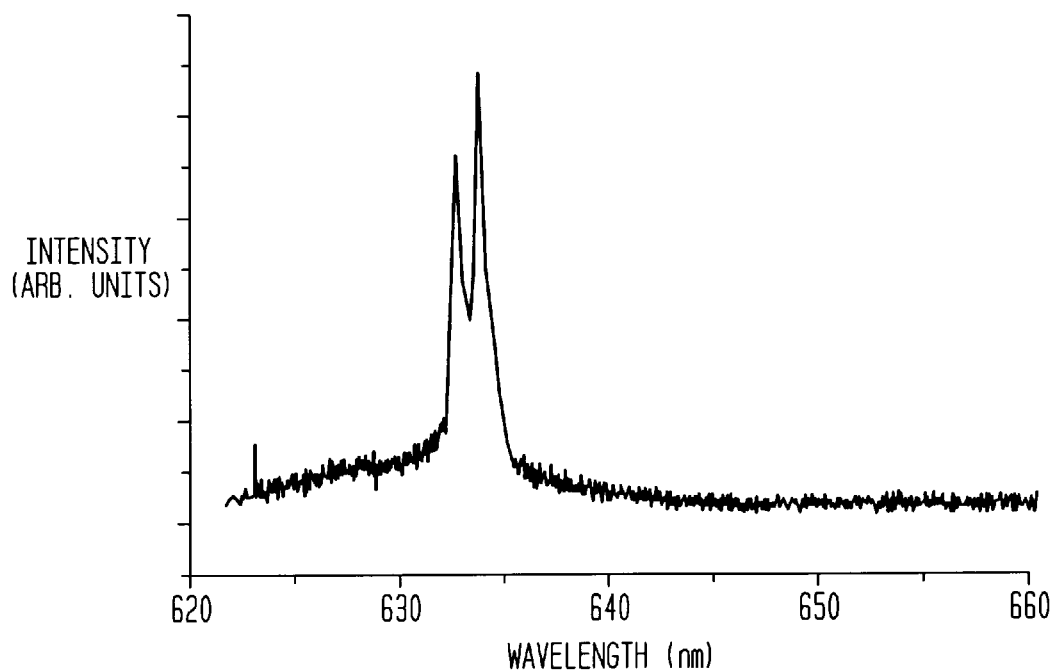
FIGS. 7A and 7B are graphs reflecting the emission profiles of DFB waveguide lasers in which the laser of FIG. 7A was formed by depositing gain media on a grating etched into a ridge waveguide structure; and the laser of FIG. 7B was formed by molding gain media deposited on a ridge waveguide structure.
Figure 7B:
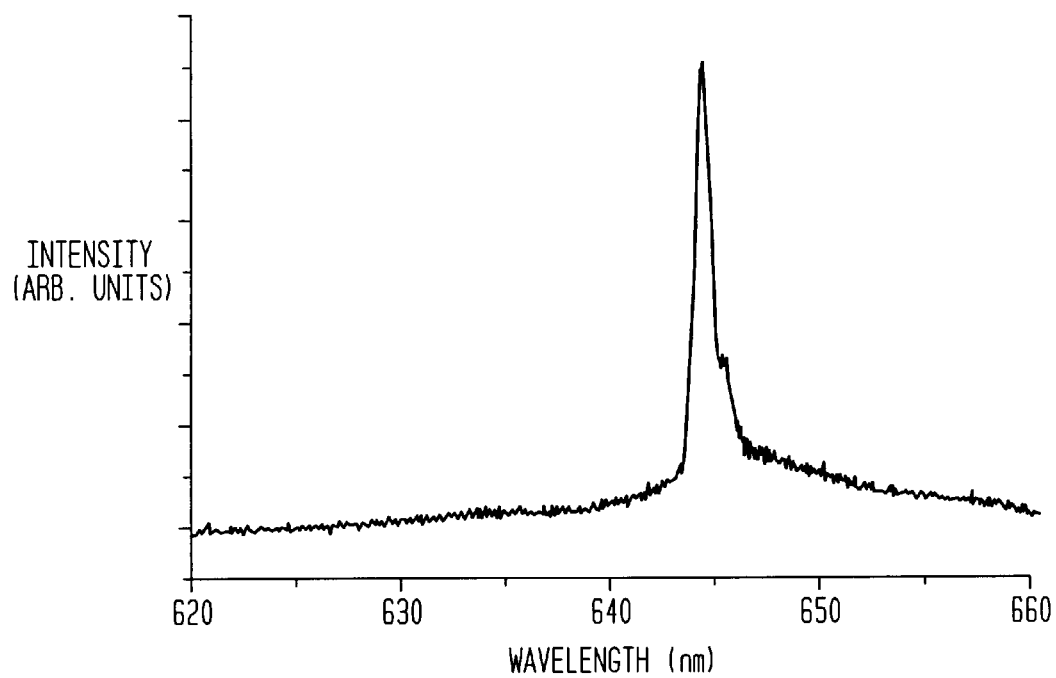

FIGS. 7A and 7B are graphs reflecting the emission profiles of DFB waveguide lasers formed by microprinting and molding, respectively. The emissions were measured by photopumping (with a pulsed nitrogen laser) ~1 mm$^2$ areas on samples having 10 μm waveguides. The lasers of FIG. 7A were formed by depositing gain media on a resonator that had been formed by printing 300 nm lines on the top surfaces of ridge waveguides (as in FIGS. 2A–2D). The lasers of FIG. 7B were formed by molding gain media that had been deposited on the ridge waveguide structure (as in FIGS. 3A–3D). In both cases, lasing occurred approximately at the third harmonic of the DFB structures. Although the lasing thresholds were similar for these devices, as can be seen the printed laser (FIG. 7A) shows two partially overlapping peaks, while the molded laser (FIG. 7B) shows one. The double peak in the emission spectrum of the laser formed by printing is consistent with distributed feedback dominated by variations in index of refraction. When the gain media is deposited onto the periodic relief structure after the printing process (subsequent to FIG. 2D), a uniform thickness of gain media may lead to variations mainly in the effective refractive index of the waveguide. The presence of a single peak in the molded laser is consistent with feedback due mainly to variations in gain. The molding procedure may cause variations in the thickness of the gain media that in principle modulate the effective index as well as the gain. Intuitively, one skilled in the art would expect that the waveguide geometry would decrease the lasing threshold; however, the inventors herein discovered that this expectation is not fulfilled.

The present invention may be embodied in other specific forms without departing from the spirit or essential attributes therefor. All such variations and modifications are intended to be included within the scope of the appended claims.

We claim:

1. An article comprising an optical or electronic device having a substrate with a non-planar surface including a patterned layer having a resolution of about 30 μm or smaller, the patterned layer formed directly on the non-planar surface with the use of a relief member comprising an elastomeric or mechanically flexible material.

2. The article of claim 1 in which the substrate comprises a base layer and an active layer, the active layer having the non-planar surface, wherein the active layer comprises at least one gain material.

3. The article of claim 2 in which the base layer is comprised of plastic or glass.

4. The article of claim 1 in which the substrate comprises a material that is substantially transparent to light with wavelengths between about 0.1 and 100 microns.

5. The article of claim 1 in which the patterned layer has a resolution of about 1 μm or smaller.

6. The article of claim 1 in which the device comprises a distributed-feedback ridge waveguide structure having a base layer and an oxide layer in which the top surface of the oxide layer comprises ridge waveguides.

7. The article of claim 1 in which the device comprises at least one of a grating, photonic crystal, spectral filter or reflector.

8. The article of claim 1 in which the device comprises at least one of a periodic array of structures with dimensions less than 1 micron.

* * * * *